(12) United States Patent
Uesaka et al.

(10) Patent No.: US 8,333,595 B2
(45) Date of Patent: Dec. 18, 2012

(54) COAXIAL CONNECTOR

(75) Inventors: Ryo Uesaka, Ebina (JP); Akinori Mizumura, Yokohama (JP)

(73) Assignee: Molex Incorporated, Lisle, IL (US)

( * ) Notice: Subject to any disclaimer, the term of this patent is extended or adjusted under 35 U.S.C. 154(b) by 0 days.

(21) Appl. No.: 13/142,185

(22) PCT Filed: Dec. 21, 2009

(86) PCT No.: PCT/US2009/069001
§ 371 (c)(1),
(2), (4) Date: Sep. 6, 2011

(87) PCT Pub. No.: WO2010/075285
PCT Pub. Date: Jul. 1, 2010

(65) Prior Publication Data
US 2011/0312215 A1 Dec. 22, 2011

(30) Foreign Application Priority Data
Dec. 24, 2008 (JP) .................. 2008-327309

(51) Int. Cl.
*H01R 12/00* (2006.01)

(52) U.S. Cl. .......................................... 439/63

(58) Field of Classification Search ............ 439/63, 439/581, 700, 824
See application file for complete search history.

(56) References Cited

U.S. PATENT DOCUMENTS

| | | | |
|---|---|---|---|
| 5,175,493 A * | 12/1992 | Langgard | 324/750.27 |
| 7,597,588 B1 * | 10/2009 | Hyzin et al. | 439/578 |
| 7,909,613 B2 | 3/2011 | Lee et al. | |
| 7,946,853 B2 | 5/2011 | Breinlinger et al. | |
| 2010/0015849 A1 * | 1/2010 | Lee et al. | 439/578 |
| 2011/0312215 A1 * | 12/2011 | Uesaka et al. | 439/581 |

FOREIGN PATENT DOCUMENTS

| | | |
|---|---|---|
| FR | 2001-08952 | 1/2003 |
| JP | H59-011326 | 8/1985 |
| JP | H06-063156 | 10/1995 |

OTHER PUBLICATIONS

International Search Report and Written Opinion for PCT Patent Application No. PCT/US2009/069001, dated Mar. 3, 2010.

* cited by examiner

*Primary Examiner* — Neil Abrams
*Assistant Examiner* — Phuongchi Nguyen
(74) *Attorney, Agent, or Firm* — Timothy M. Morella

(57) ABSTRACT

A coaxial connector (1), which is attached to a circuit board (2) having a land (151), includes a coaxial terminal (51) having a coaxial structure including a centre terminal (52) and a cylindrical outer terminal (61) surrounding the centre terminal; a housing (11) accommodating the coaxial terminal; a cylindrical contact (81) movable in an axial direction of an axis of the outer terminal and brought into contact with the land; a biasing member (71) biasing the cylindrical contact so that the cylindrical contact projects from the housing; and a rotation mechanism which rotates the cylindrical contact about the axis when the cylindrical contact is pushed into the housing against a biasing force of the biasing member. Accordingly, the coaxial connector capable of performing wiping in a terminal having the coaxial structure, such as a probe, is provided.

6 Claims, 20 Drawing Sheets

Prior Art

COAXIAL CONNECTOR

CROSS REFERENCE TO RELATED APPLICATION

The present application claims priority from Japanese Patent Application No. 2008-327309, filed on Dec. 24, 2008, the disclosure of which is incorporated herein by reference in its entirety.

FIELD OF THE INVENTION

The present invention relates to a coaxial connector.

DESCRIPTION OF THE RELATED ART

Japanese Utility Model Application Laid-open No. 60-123666 discloses a coaxial movable contact terminal 851, as shown in FIG. 19, which is used in an inspection apparatus. The coaxial movable contact terminal 851 includes a center conductor 852 and an outer conductor 861 having a plain cylindrical shape and surrounding the center conductor 852. As shown in FIG. 20, the terminals 851 are held by a movable plate 802 movable relative to a target circuit board 801 on which ICs (Integrated Circuits) are mounted as targets of measurement. Further, coaxial connectors (hereinafter referred to as "coaxial plugs") 961 are connected to one ends of the terminals 851, respectively. Each of the coaxial plugs 961 is connected via a coaxial cable 962 to a measuring circuit board (not shown) on which a signal generator circuit, a comparator, etc. are mounted. At the time of the measurement, the movable plate 802 is moved toward the target circuit board 801 to bring the other ends of the terminals 851 into contact with the target circuit board 801. Consequently, the coaxial plugs 961 are electrically connected to the target circuit board 801 by the terminals 851, to thereby electrically connect the target circuit board 801 and the measuring circuit board to each other.

By using the coaxial terminals 851, a high-frequency component of a signal is hardly attenuated or reflected in the terminals. Accordingly, an input signal outputted by the signal generator circuit in the measuring circuit board is transmitted or transferred to the target circuit board 801 via the terminals 851 as maintaining its waveform satisfactorily. Further, an output signal outputted by an IC as the target of the measurement (measurement target) in the target circuit board 801 is transmitted to the measuring circuit board via the terminals 851 while maintaining its waveform satisfactorily.

However, the coaxial movable contact terminals 851 of Japanese Utility Model Application Laid-open No. 60-123666 are press-fit in cavities 814 formed in the movable plate 802; and the movable plate 802 is moved toward the target circuit board 801 to thereby move the coaxial movable contact terminals 851 upwardly and downwardly so that the terminals 851 are brought into contact with the target circuit board 801. As described above, the coaxial movable contact terminals 851 are merely in pressure contact with the target circuit board 801 from below. Therefore, for example, in a case that oxide film, etc. is formed on a surface of a land of the target circuit board 801, there is a fear that the connection resistance is increased due to the oxide film, which in turn creates a possibility that high-frequency signals cannot be received in a desired waveform via the coaxial movable contact terminals 851.

Japanese Patent Application Laid-open No. 7-272810 discloses a movable contact pin device for an IC socket. An IC package is mounted on the movable contact pin device. At the time of the mounting, a contact member, of the movable contact pin device, which construct the movable contact pin device is brought into pressurized contact with a connection terminal of the IC package, and then the contact member is rotated by another twisted member constructing the movable contact pin device. In such a manner, the contact member is rotated in a state that the contact member is in contact with the connection terminal to thereby perform wiping. By doing so, it is possible to rub off or remove the oxide film, etc. from the surfaces of the connection terminal and the contact member, making it possible to suppress the increase in connection resistance.

In the contact rotation mechanism of Japanese Patent Application Laid-open No. 7-272810, however, the contact member is rotated by using the another twisted constructing member which constructs the movable contact pin device. Therefore, it is necessary to arrange the another twisted constructing member at the position of the rotation axis of the contact member. Therefore, in a case that an attempt is made to rotate the outer conductor 861 in the coaxial movable contact terminal 851 disclosed in Japanese Utility Model Application Laid-open No. 60-123666, it is necessary to arrange the another twisted constructing member at a position of the rotation axis of the outer conductor 861. In the coaxial movable contact terminal 851, however, the center conductor 852 needs to be arranged at the center of the outer conductor 861. Thus, in the coaxial movable contact terminal 851 disclosed in Japanese Utility Model Application Laid-open No. 60-123666, even if the attempt were made to arrange the another twisted constructing member, disclosed in Japanese Patent Application Laid-open No. 7-272810, at the position of the rotation axis of the outer conductor 861, it is not possible to arrange the another twisted constructing member disclosed in Japanese Patent Application Laid-open No. 7-272810 at the position of the rotation axis since the center conductor 852 is already arranged at the position. As a result, in the coaxial movable contact terminal 851, it is not possible to rotate the outer conductor 861 by using the another twisted constructing member in order to perform the wiping, and thus it is not possible to suppress the increase in connection resistance in the coaxial movable contact terminal 851.

SUMMARY OF THE INVENTION

An object of the present invention is to provide a coaxial connector capable of perform wiping in a terminal having coaxial structure such as a probe.

According to the present invention, there is provided a coaxial connector 1 which is attached to a circuit board 2 having a land 151, the coaxial connector 1 including: a coaxial terminal 51 which has a coaxial structure including a center terminal 52 and a cylindrical outer terminal 61 surrounding the center terminal 52; a housing 11 which accommodates the coaxial terminal 51; a cylindrical contact 81 which is movable in an axial direction of an axis of the outer terminal 61 and which is brought into contact with the land 151; a biasing member 71 which biases the cylindrical contact 81 so that the cylindrical contact 81 projects from the housing 11; and a rotation mechanism which rotates the cylindrical contact 81 about the axis when the cylindrical contact 81 is pushed into the housing 11 against a biasing force of the biasing member 71. In the present application, the term "land" means a contact point, which is provided on the circuit board, at which the connector is brought into contact with the circuit board and which has any shape. The land may include, for example, a pad, etc.

Since the cylindrical contact 81 is biased in such a manner by the biasing member so as to project from the housing 11, the cylindrical contact 81 is first brought into contact with the land 151 of the circuit board 2 when the coaxial connector 1 is attached to the circuit board 2. Afterwards, the cylindrical contact 81 is pushed or pressed into the housing 11, whereby the coaxial connector 1 is attached to the circuit board 2. Then, during a period of time until the coaxial connector 1 is attached to the circuit board 2, the cylindrical contact 81 brought into contact with the land 151 of the circuit board 2 is rotated about or with respect to the axis by the rotation mechanism.

Accordingly, since the cylindrical contact 81 is rotated in a state that the cylindrical contact 81 is in contact with the land 151 of the circuit board 2, it is possible to rub the cylindrical contact 81 and the land 151 against each other to thereby wiping the cylindrical contact 81 and the land 151. Further, with this wiping, it is possible to rub off or remove an oxide film from a contact portion, of the cylindrical contact 81, which is brought into contact with the land 151 and the surface of the land 151 of the circuit board 2 and to remove dust or dirt which has been caught between the cylindrical contact 81 and the land 151, thereby making it possible to suppress the increase in contact resistance between the outer terminal 61 and the circuit board 2. In the present application, it is possible to perform the wiping in such a manner in the terminal having the coaxial structure.

Further, the biasing member makes the biasing force constantly act on the cylindrical contact 81 so that the cylindrical contact 81 projects from the housing 11. Therefore, the cylindrical contact 81 rotates (is rotated) in a state that the cylindrical contact 81 is in pressure contact with the land 151 due to the biasing force. Therefore, even when the housing 11 is strongly pressed against the circuit board 2, the cylindrical contact 81 is not brought into pressure contact against the land 151 with a force which is greater than the biasing force, thereby making it possible to prevent any damage of the cylindrical contact 81 and/or the land 151 which would be otherwise caused if the cylindrical contact 81 were brought into pressure contact against the circuit board with an excessively strong force. In addition, the biasing member continuously makes the cylindrical contact 81 brought into pressure contact with the land 151 even after the coaxial connector 1 is attached to the circuit board 2. Therefore, it is possible to maintain a state that the contact resistance is lowered between the cylindrical contact 81 and the land 151.

The biasing member may be a member which is elastically deformable such as, for example, a coil spring, a leaf spring or the like. In a case that the biasing member is a coil spring 71 which is arranged coaxially with the coaxial terminal 51, the rotation mechanism which rotates the cylindrical contact 81 may include a projection 84 which is formed in the cylindrical contact 81 and with which one end of the coil spring 71 is brought into contact; and the cylindrical contact 81 may be rotated when the coil spring 71 is expanded or compressed to pull or push the projection 84.

In such a manner, by expanding or compressing the coil spring 71 to thereby pull or push the projection 84 formed in the cylindrical contact 81, it is possible to use the coil spring 71 as the biasing member also in the rotation mechanism rotating the cylindrical contact 81. This makes it possible to reduce the number of components or parts arranged around the coaxial terminal 51 and to simplify the structure of the terminal. In addition, the coil spring 71 can be arranged coaxially with the coaxial terminal 51 in a state that, for example, the coil spring 71 is wound around the outer terminal 61. As a result, it is possible to reduce an area or range occupied by each of the coaxial terminals 51 in the housing 11, thereby making it possible to arrange, in the housing 11, a plurality of pieces of the coaxial terminal 51 at a pitch that is same as that of conventional coaxial terminals which is not provided with the coil spring 71, etc.

Further, in the present invention, the coil spring 71 may be brought into contact with the projection 84 in a state that the coil spring 71 is compressed. By bringing the coil spring 71 in the compressed state into contact with the projection 84, it is possible to push and rotate the cylindrical contact 81 in assured manner. Further, when the cylindrical contact 81 is pushed into the housing 11 to further compress the coil spring 71, the force pushing (pressing) the cylindrical contact 81 becomes greater, thereby making it possible to rotate the cylindrical contact 81 assuredly even if the cylindrical contact 81 is hooked to or caught by the land 151. On the other hand, in a case that the projection 84 is pulled by the expanded coil spring 71, the cylindrical contact 81 is pushed into the housing 11 to thereby suppress the expansion of the coil spring 71, thus cancelling the force pulling the projection 84.

Furthermore, in the present invention, the rotating mechanism which rotates the cylindrical contact 81 may further include: a fix portion 26 which is formed in the coaxial terminal 51 or the housing 11, and a movable portion 85 which is formed in the cylindrical contact 81 and which is engaged with the fix portion 26; and the cylindrical contact 81 may start to rotate when the cylindrical contact 81 is pushed into the housing 11 to disengage the movable portion 85 from the fix portion 26.

In this manner, when the cylindrical contact 81 is pushed into the housing 11 to thereby disengage the movable portion 85 from the fix portion 26 (release the engagement between the fix portion 26 and the movable portion 85), the cylindrical contact 81 starts to rotate. Accordingly, it is possible to prevent the cylindrical contact 81 from rotating when the cylindrical contact 81 is not pushed into the housing 11, and to make the cylindrical contact 81 rotate when the cylindrical contact 81 is pushed into the housing 11 against the biasing force of the biasing member.

In particular, in a case that the coil spring 71 as the biasing member is a mechanism which rotates the cylindrical contact 81 when the coil spring 71 is brought into contact with the projection 84 formed in the cylindrical contact 81, the coil spring 71 is in a compressed state when the cylindrical contact 81 is pushed into the housing 11 to thereby disengage the movable portion 85 from the fix portion 26. Therefore, when the cylindrical contact 81 starts rotating, the coil spring 71 in the compressed state is brought into contact with the projection 84. Therefore, even if the cylindrical contact 81 is caught by or hooked to the land 151 before the cylindrical contact 81 starts rotating, it is possible to surely rotate the cylindrical contact 81 by the force releasing the compression of the spring force 71.

Moreover, in the present invention, the rotation mechanism may further include a restricting portion 27 which is formed in the coaxial terminal 51 or the housing 11 and which is engaged with the movable portion 85, disengaged from the fix portion 26, to restrict movement of the movable portion 85. By providing, in such a manner, the restricting portion 27 which is engaged with the movable portion 85 disengaged from the fix portion 26, it is possible to restrict (regulate) a range in which the cylindrical contact 81 is rotated to a range in which the movable portion 85 is moved from the fix portion 26 to the restricting portion 27. That is, by limiting a rotation amount of the cylindrical contact 81, it is possible to restrict a range in which the wiping is performed on the land 151 (circuit board 2).

Further, in the present invention, the cylindrical contact 81 may have a plurality of projecting contact points 83 which are arranged on the cylindrical contact 81 at rotationally symmetric positions of a cylindrical shape of the cylindrical contact to project from the cylindrical contact and which are brought into contact with the land 151.

In this case, it is possible to bring the cylindrical contact 81 into contact with the land 151 at the plurality of projecting contact points 83 in assured manner, and to wipe the land 151 assuredly. Further, it is enough that the land 151 is formed on the circuit board 2 at a range in which the plurality of projecting contact points 83 perform the wiping (range in which the plurality of projecting contact points 83 are brought into contact with the land 151). On the other hand, in a case that the plurality of projecting contact points 83 is not provided, the contact range on the circuit board 2 which is brought into contact with the cylindrical contact 81 cannot be determined, which in turn necessitate forming, for example, a doughnut-shaped land corresponding to the cylindrical shape of the cylindrical contact 81, or creating possibility such that the cylindrical contact 81 erroneously wipes a portion, of the circuit board 2, which is different from the land 151.

As described above, in the coaxial connector of the present invention, it is possible to perform the wiping in the terminal having the coaxial structure such as a probe.

DETAILED DESCRIPTION OF THE PREFERRED EMBODIMENTS

In the following, an explanation will be given about an embodiment of a coaxial connector of the present invention with reference to the drawings. It should be noted that the embodiment described below is an example of a preferred embodiment of the present invention and is not intended to limit the present invention.

Figure 1:
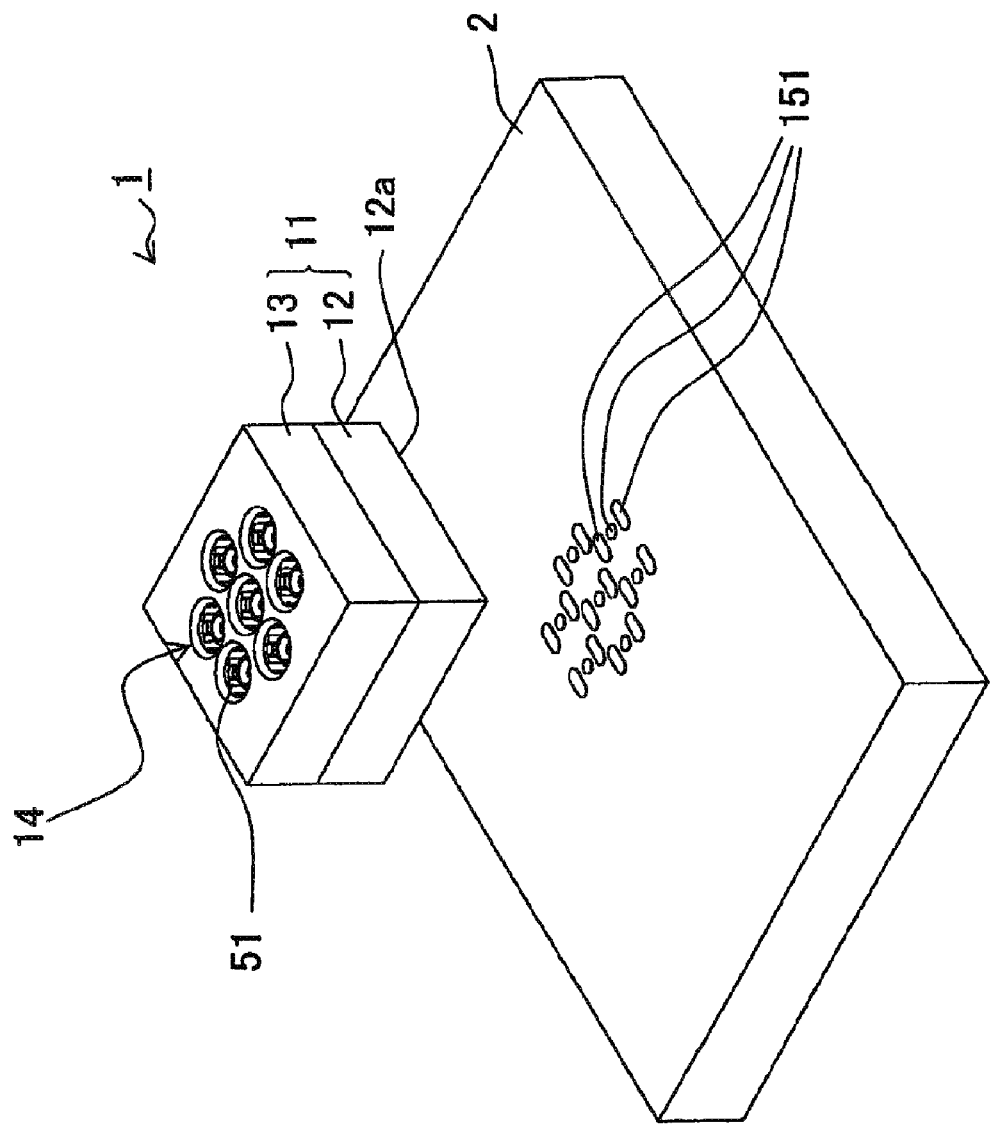
FIG. 1 is a perspective view of a connector of an embodiment of the present invention and a circuit board.

FIG. 1 is a perspective view of a connector 1 of the embodiment seen from obliquely above. FIG. 1 also shows a circuit board 2 to which the connector 1 is to be attached. The connector 1 has a housing 11 which is formed in a cubic shape by using an insulating material such as resin; a plurality of cavities 14 which penetrate through the housing 11 in an up and down direction; and a plurality of coaxial terminals 51 each of which has a coaxial structure including a center terminal 52 and an outer terminal 61 and which are accommodated in the cavities 14, respectively.

As shown in FIG. 1, a plurality of lands 151 are formed in the circuit board 2. Electric wirings such as through holes (not shown) are connected to the lands 151.

Figure 9:
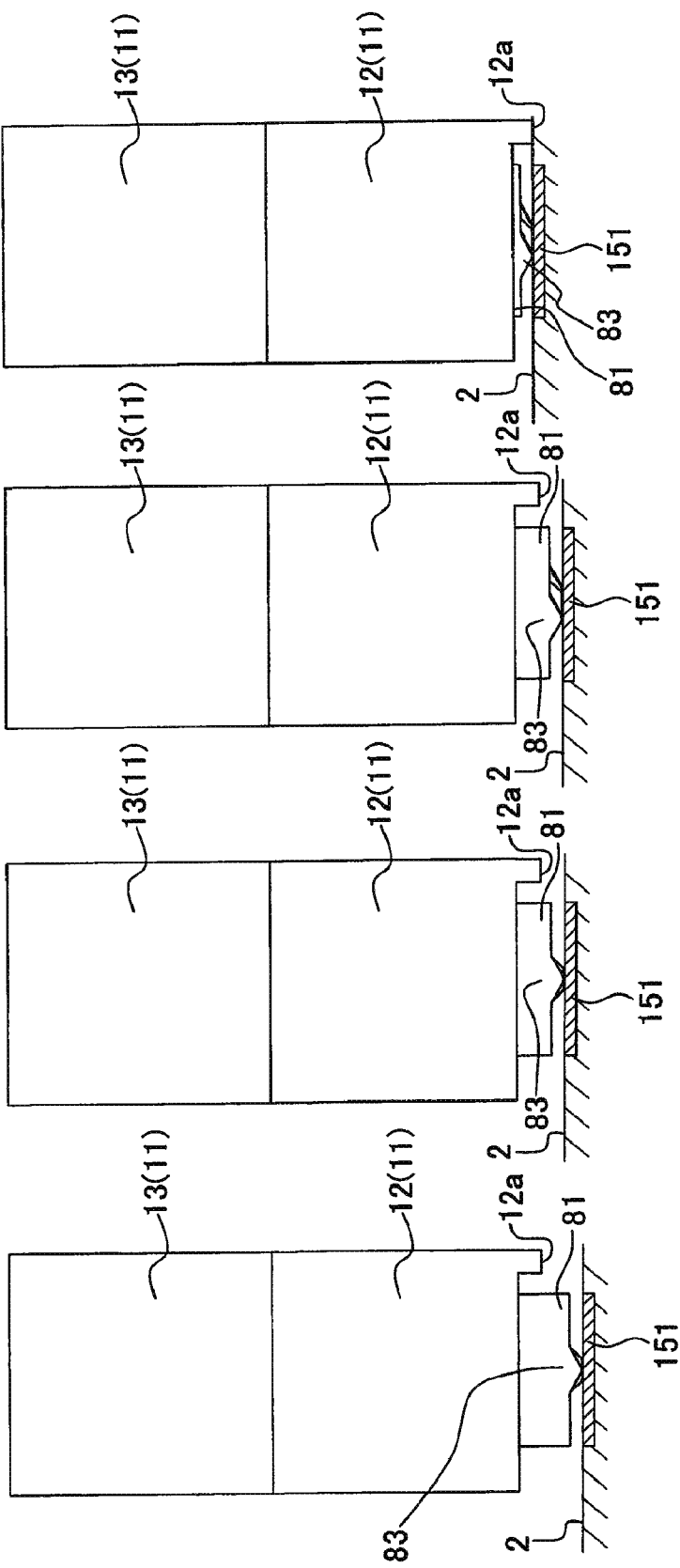
FIGS. 9A to 9D are explanatory views each showing a state when the connector shown in FIG. 1 is attached to the circuit board.
Figure 17:
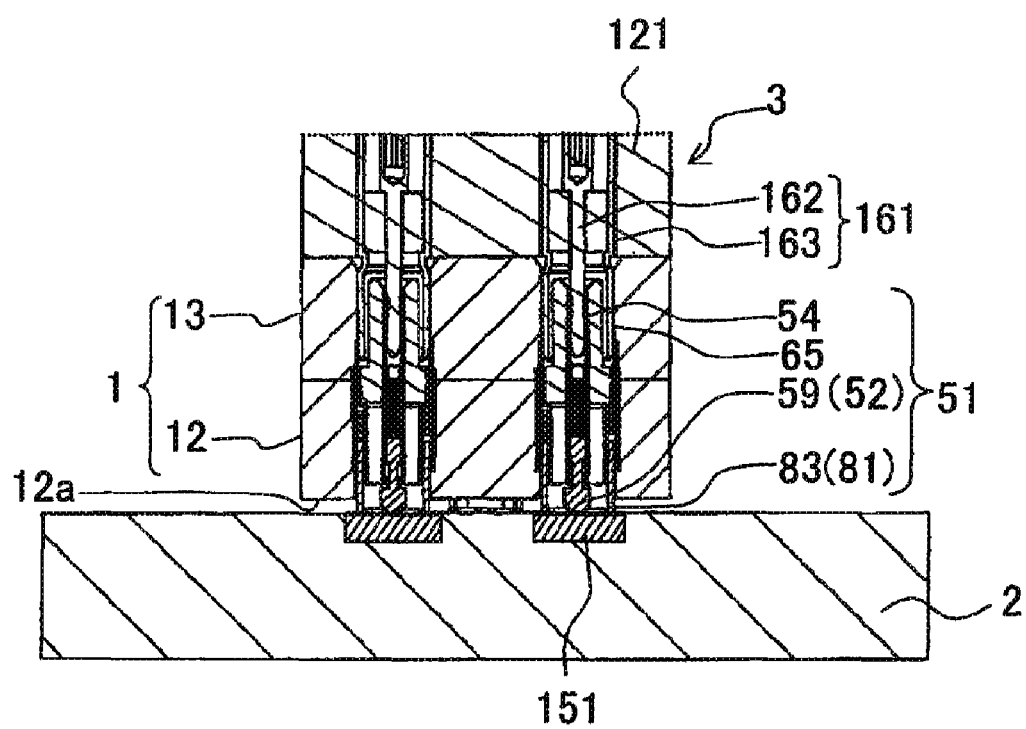
FIG. 17 is a vertical sectional view showing a state that the holder in FIG. 16 is connected to the connector in the state shown in FIG. 9D.

As shown in FIGS. 9D and 17 (which will be described later), the connector 1 is attached to the circuit board 2 at a lower surface 12a of the housing 11. Further, in each of the coaxial terminals 51, the center terminal 52 and the outer terminal 61 which project downward from the housing 11 are brought into contact with and electrically connected to three pieces of the land 151, the lands 151 being aligned on the circuit board 2 such that land rows are each formed of three pieces of the land 151.

Figure 2:
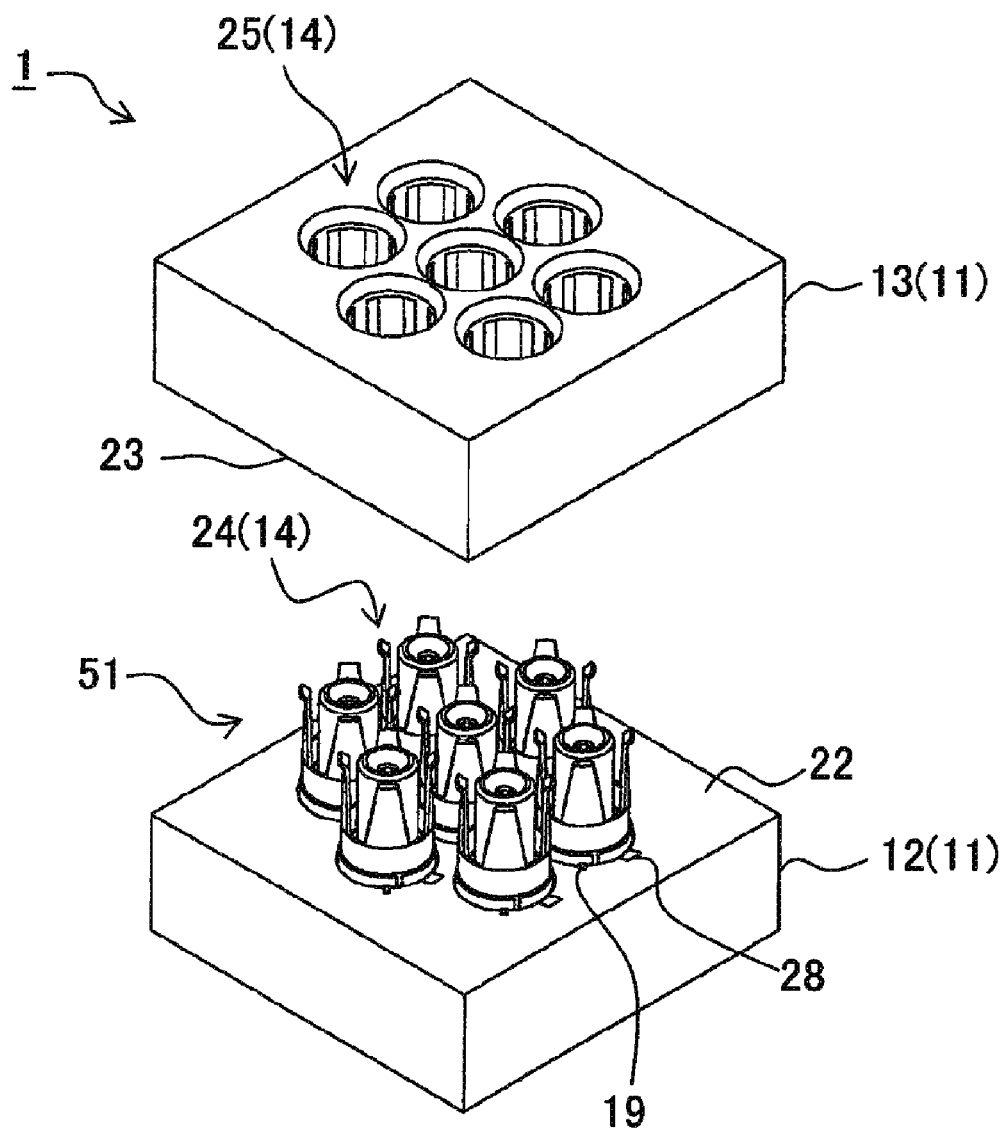
FIG. 2 is a partial exploded perspective view of the connector shown in FIG. 1.

FIG. 2 is an exploded perspective view of the housing 11. The housing 11 is vertically divided into two parts by a plane extending in parallel to the circuit board 2 and thereby includes a lower housing 12 and an upper housing 13. The lower housing 12 is positioned under the upper housing 13 in FIG. 1 and is directly attached to the circuit board 2; and a lower surface 23 of the upper housing 13 and an upper surface 22 of the lower housing 12 are in contact with each other. Further, the plurality of cavities 14 are formed in the housing 11. Each of the cavities 14 is constructed of a lower cavity 24 formed in the lower housing 12 and an upper cavity 25 formed in the upper housing 13.

Figure 5:
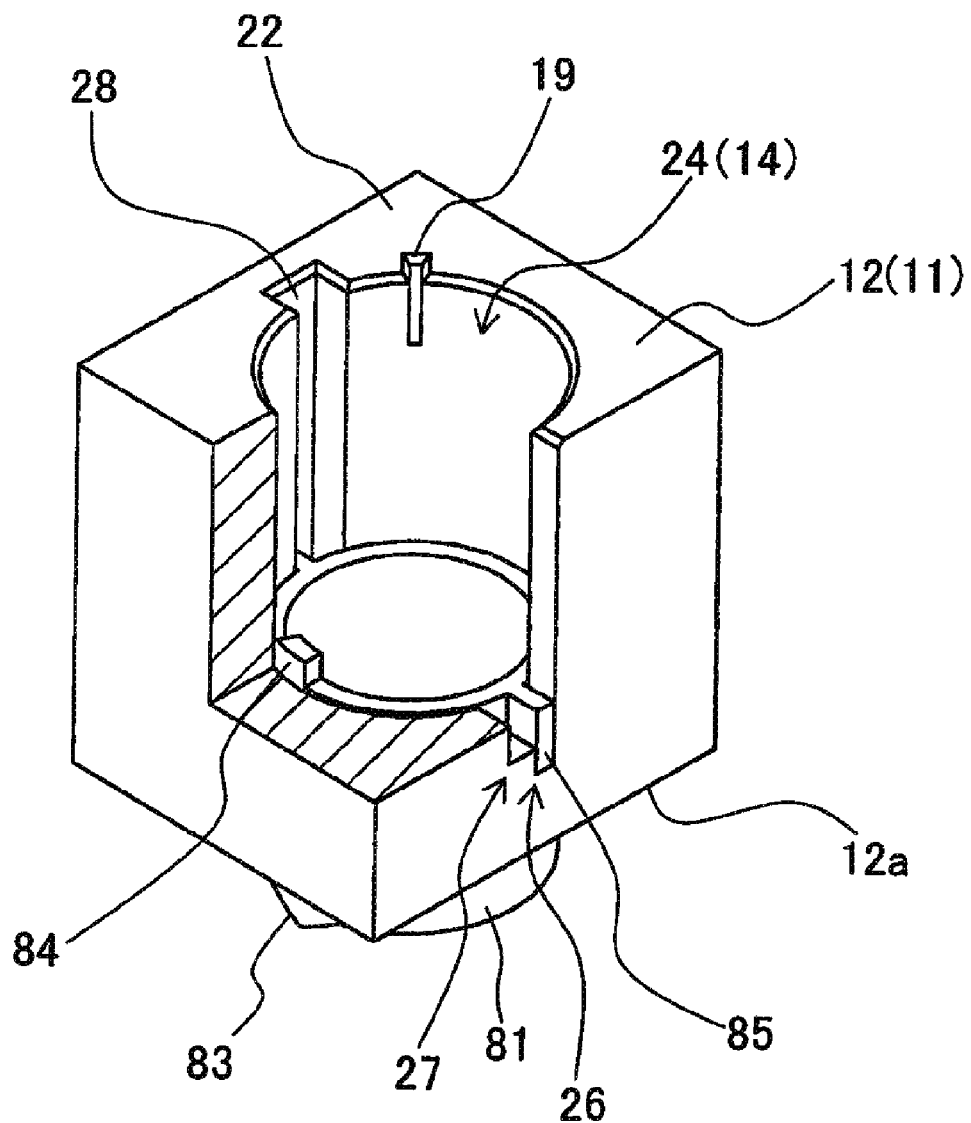
FIG. 5 is a view showing a partial assembly state of the connector shown in FIG. 1, with a partial cutout.

Furthermore, in the lower housing 12, two pieces of an anchor press-fit slit 19 and two pieces of a movable piece-slit 28 are formed to communicate with each of the lower cavities 24. Moreover, as shown in FIG. 5 (which will be described later), a lower end portion of each of the movable piece-slits 28 functions as a restricting recess portion 27; and a fix recess portion 26a is defined by a groove extending downwardly from the restricting recess portion 27. The two anchor press-fit slits 19 the two movable piece-slits 28 are both formed in the lower housing 12 such that the two anchor press-fit slits 19 are arranged to be rotationally symmetric with respect to the lower cavity 24 having columnar shape (that is, arranged at an interval of 180 degrees), and that the two movable piece-slits 28 are arranged to be rotationally symmetric with respect to the lower cavity 24 having columnar shape (that is, arranged at an interval of 180 degrees).

Figure 3:
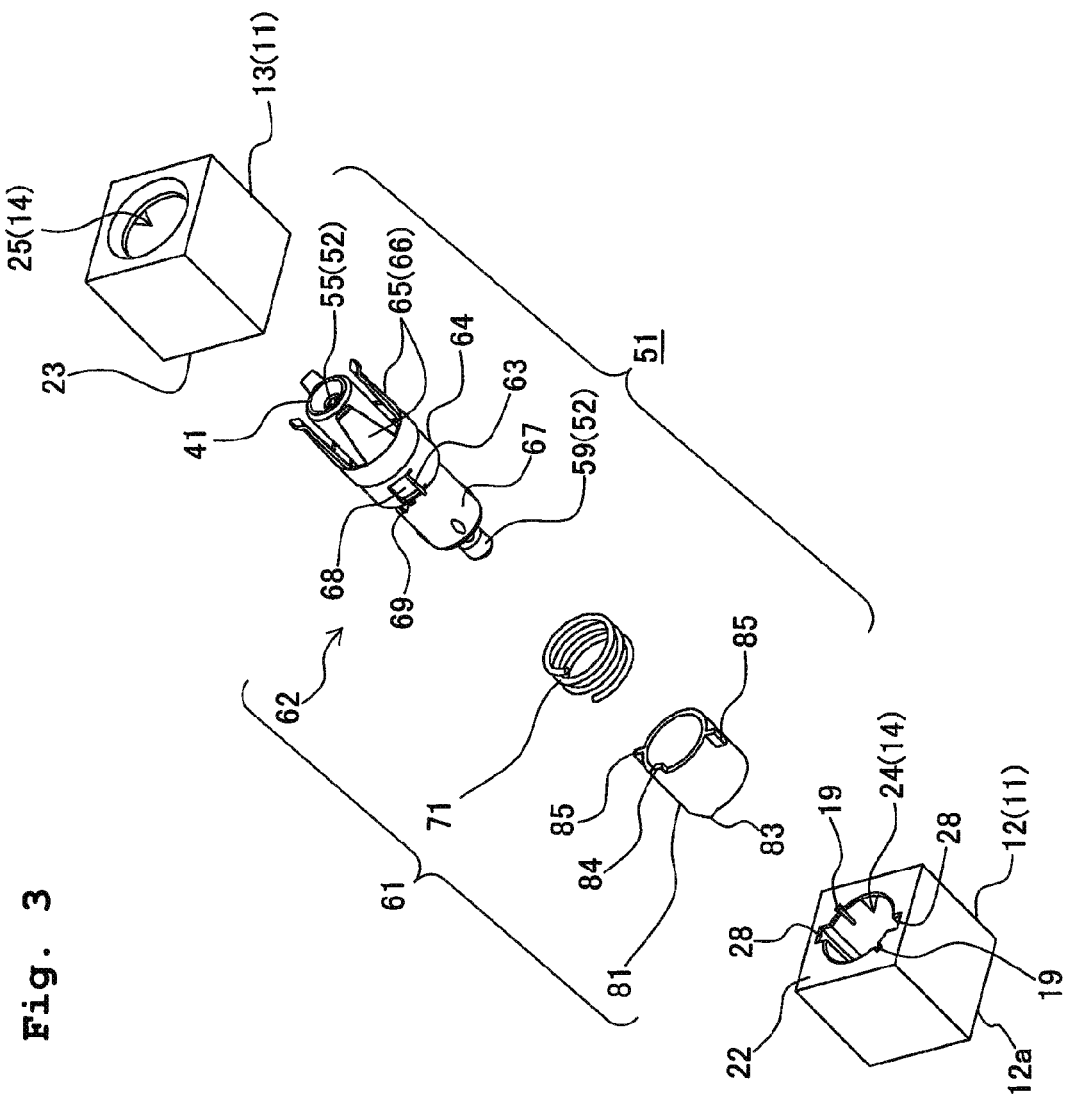
FIG. 3 is a partial exploded perspective view of a housing and a coaxial terminal in FIG. 2.
Figure 4:
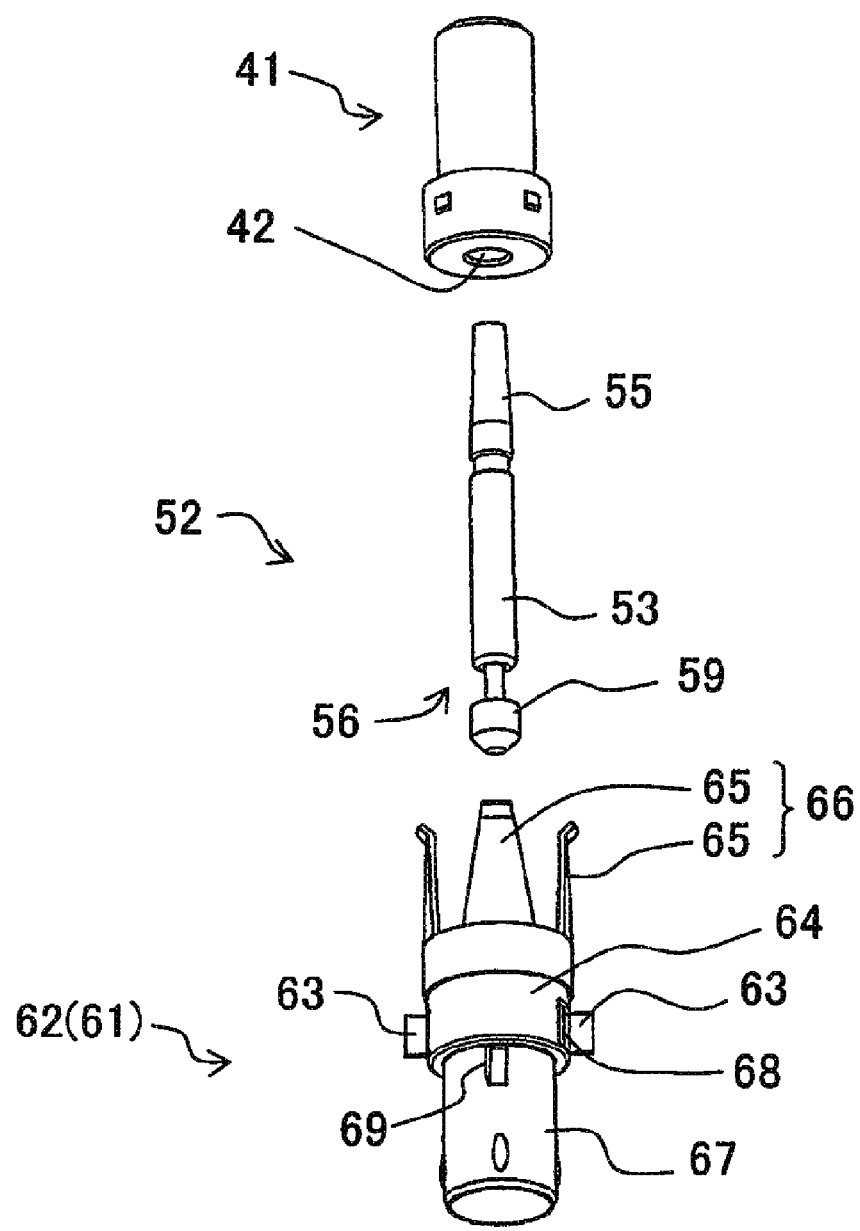
FIG. 4 is a partial exploded perspective view of a portion of the coaxial terminal shown in FIG. 3.

FIGS. 3 and 4 are each an exploded view of the coaxial terminal 51 which is accommodated in the cavity 14.

Figure 16:
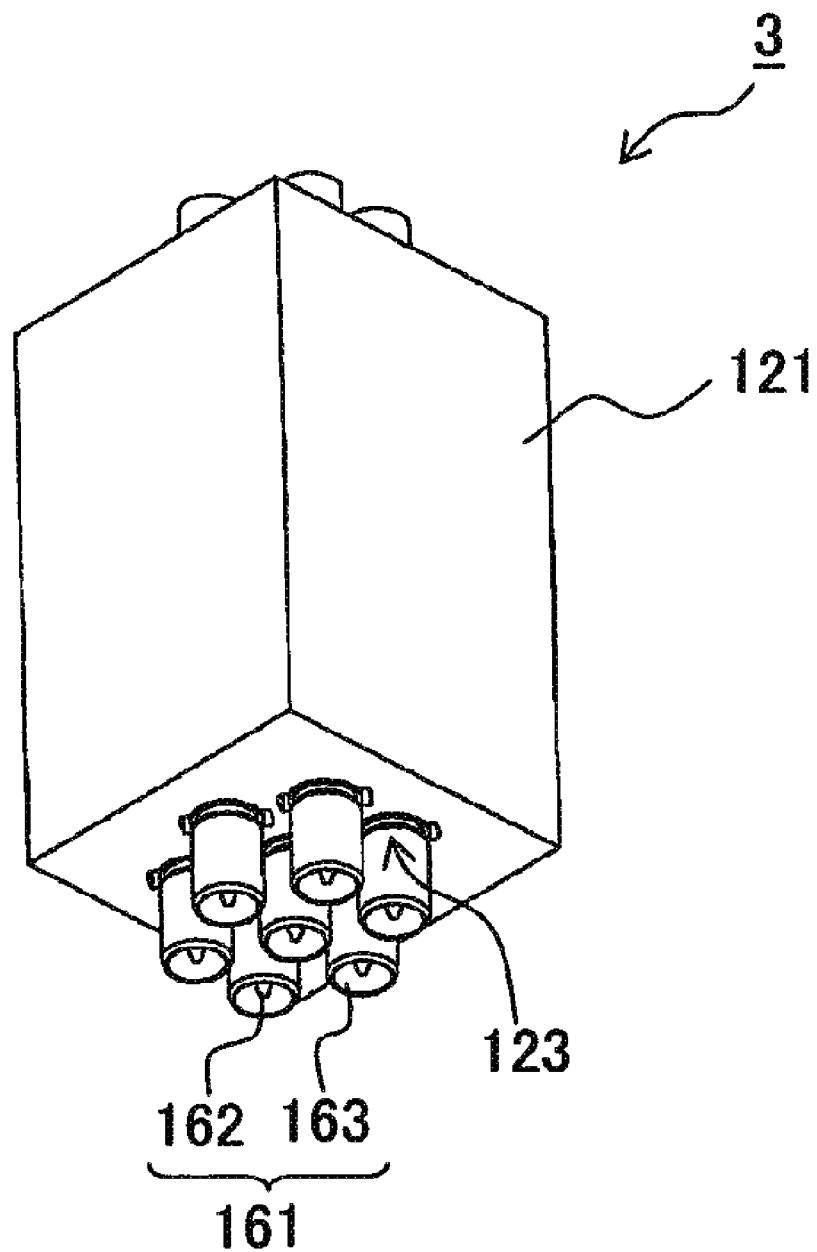
FIG. 16 is a perspective view of a holder which is to be connected to the connector in FIG. 1.

Each of the coaxial terminals 51 includes the center terminal 52, the outer terminal 61, and an insulator 41 via which the outer terminal 61 holds the center terminal 52 in an insulated state; and each of the coaxial terminals 51 is accommodated in one of the cavities 14 formed in the housing 11 as shown in FIG. 2. The center terminal 52 is mated with an axial terminal 162 of a coaxial plug 161 as shown in FIG. 16 (to be described later); and the outer terminal 61 is mated with a surrounding terminal 163 of the coaxial plug 161.

As shown in FIG. 4, the center terminal 52 includes a center conductor 53, a center coil spring (not shown), and a shaft-shaped contact 59 each of which is formed by using a conductive material. The center conductor 53 has a substantially shaft shape and has, on the upper portion thereof, a mating portion 55 holding or sandwiching the axial terminal 162 of the coaxial plug 161. Further, a center hole 56 is formed in the lower surface of the center conductor 53 having the shaft shape; and the center coil spring and one end of the shaft-shaped contact 59 are inserted in the center hole 56.

As shown in FIG. 4, the insulator 41 has a cylindrical shape and includes a large-diameter portion and a small-diameter portion which are coaxial. A center hole 42 is formed at the center of the cylindrical insulator 41, and the center terminal 52 is inserted in the center hole 42.

As shown in FIGS. 3 and 4, the outer terminal 61 includes an outer conductor 62, an outer coil spring 71 and a cylindrical contact 81 each of which is formed by using a conductive material such as a metal plate. The outer conductor 62 has a substantially cylindrical shape as a whole and includes a body portion 64 having a pair of anchors 63 projecting or protruding from the surface (outer surface) of the body portion 64; a mating portion 66 formed above the body portion 64; and a thin cylinder portion 67 which is formed below the body portion 64. The mating portion 66 is constructed of four leaf springs 65 which hold the surrounding terminal 163 of the coaxial plug 161. The thin cylinder portion 67 is formed to be thinner than the body portion 64 and is inserted in the outer coil spring 71 and the cylindrical contact 81.

As shown in FIG. 3, the cylindrical contact 81 is formed to have a cylindrical shape into which the thin cylinder portion 67 can be inserted and is movable in the axial direction of the outer terminal 61. Further, a projection 84, two movable pieces 85, and two projecting contact points 83 are formed in the cylindrical contact 81. The projection 84 projects from an upper edge portion of the cylinder of the cylindrical contact 81 such that a stepped shaped-portion is formed on the upper edge portion of the cylindrical shape of the cylindrical contact 81. Each of the movable pieces 85 projects from the outer surface of the upper portion of the cylindrical contact 81 having the cylindrical shape. Each of the projecting contact points 83 projects from the lower end of the cylindrical contact 81 having the cylindrical shape. Note that the two movable pieces 85 and the two projecting contact points 83 are both formed on the outer surface of the cylindrical contact 81 having the cylindrical shape, such that the two movable pieces 85 are arranged to be rotationally symmetric with respect to each other (that is, arranged at an interval of 180 degrees) and that the two projecting contact points 83 are arranged to be rotationally symmetric with respect to each other (that is, arranged at an interval of 180 degrees).

Upon assembling the coaxial terminal 51, the center terminal 52 is first inserted in the center hole 42 of the insulator 41, and then the insulator 41 is inserted in the outer conductor 62, whereby the center terminal 52 and the insulator 41 are assembled in the outer conductor 62 as shown in FIG. 3. In the following explanation, the outer terminal 62, in which the insulator 41 and the center terminal 52 are assembled, is referred to as "sub-assembly".

Next, assembly processes of the connector 1 as shown in FIG. 1 will be explained with reference to FIGS. 5 to 8. First, as shown in FIG. 5, the cylindrical contact 81 is inserted in the lower cavity 24. At this time, the movable pieces 85 of the cylindrical contact 81 are inserted in the movable piece-slits 28 of the lower housing 12, respectively. With this, the movable pieces 85 are accommodated in the fix recess portions 26 each forming the lower end portion of one of the movable piece-slits 28.

Figure 6:
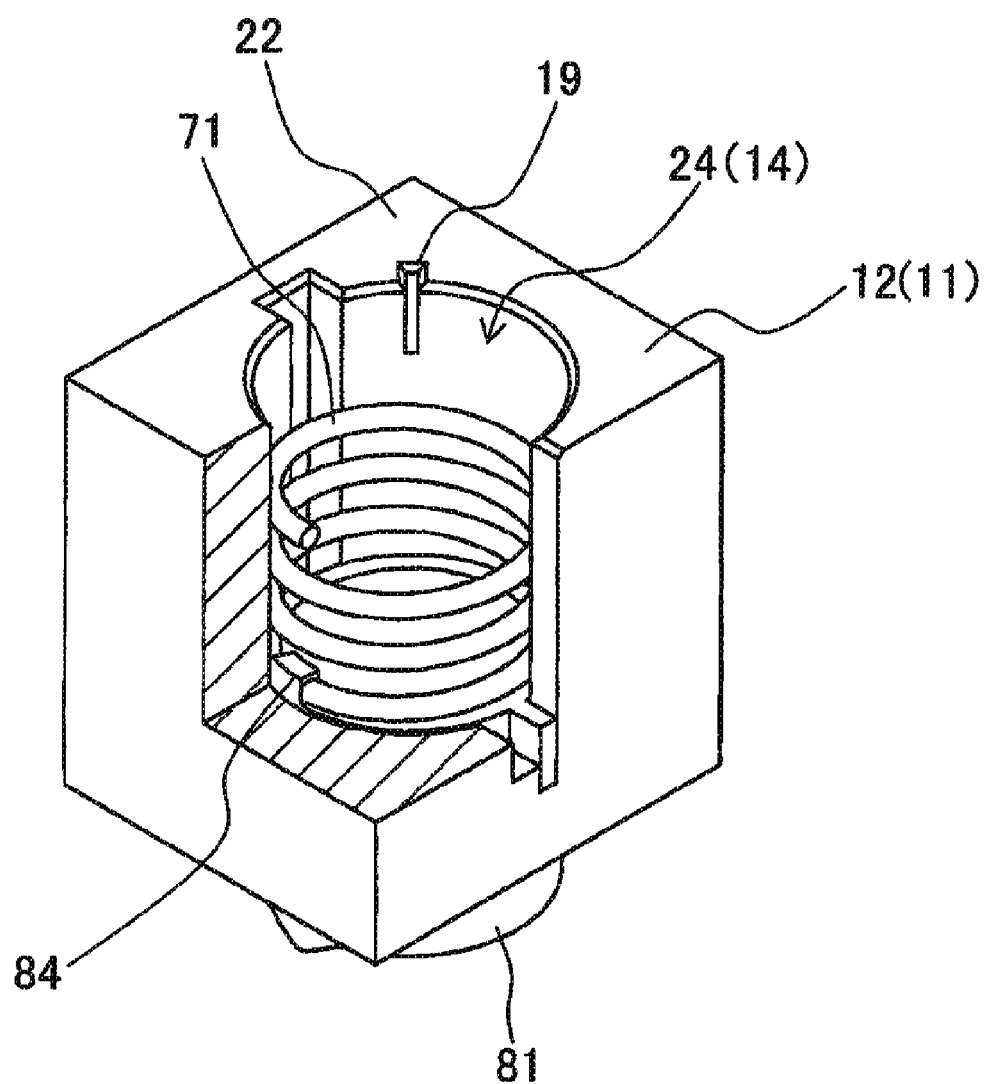
FIG. 6 is a partial view showing further partial assembly state of the connector shown in FIG. 1, with a partial cutout.

Next, as shown in FIG. 6, the outer coil spring 71 is inserted in the lower cavity 24. With this, the outer coil spring 71 is disposed above the cylindrical contact 81 in the lower cavity 24. Further, a lower end of the winding forming the outer coil spring 71 is capable of abutting on the projection 84 of the cylindrical contact 81.

Figure 7:
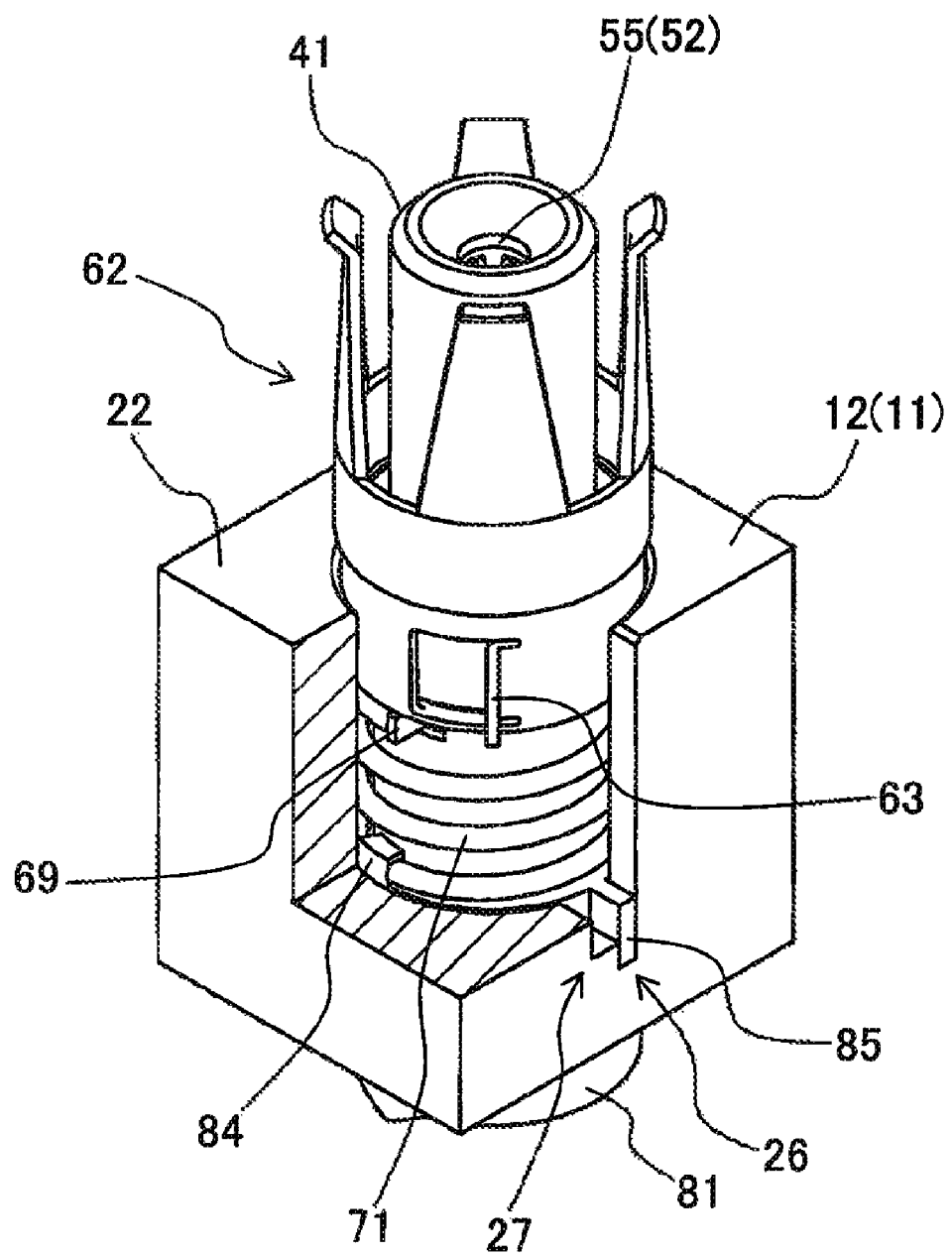
FIG. 7 is a partial view showing still further partial assembly state of the connector shown in FIG. 1, with a partial cutout.

Next, as shown in FIG. 7, the sub-assembly is inserted in the lower cavity 24. At this time, the pair of anchors 63 are press-fit in the pair of anchor press-fit slits 19 formed in the lower housing 12. With this, the sub-assembly is fixed to the lower housing 12. Further, the center terminal 52 and the outer terminal 61 of the coaxial terminal 51 are coaxially structured.

In the state that the pair of anchors 63 are press-fit in the anchor press-fit slits 19, the outer coil spring 71 is sandwiched between the outer conductor 62 and the cylindrical contact 81 to be compressed. Therefore, the lower end of the winding of the outer coil spring 71 is pressed against the projection 84 of the cylindrical contact 81; and the other end, of the winding, which is the upper end of the coil spring 71 is pressed against a fix piece 69 of the outer conductor 62. Note that a pressed state same as that described above may be provided by inserting the sub-assembly in the lower cavity 24 while twisting the sub-assembly.

Since the outer conductor 62 is in a state that the pair of anchors 63 are press-fit in the anchor press-fit slits 19 to thereby prevent the outer conductor 62 from rotating in the lower cavity 24 (cavity 14), the compressed outer coil spring 71 presses or pushes the projection 84 of the cylindrical contact 81 and thus the movable pieces 85 inserted in the fix recess portions 26 are positioned in the fix recess portions 26.

Figure 8:
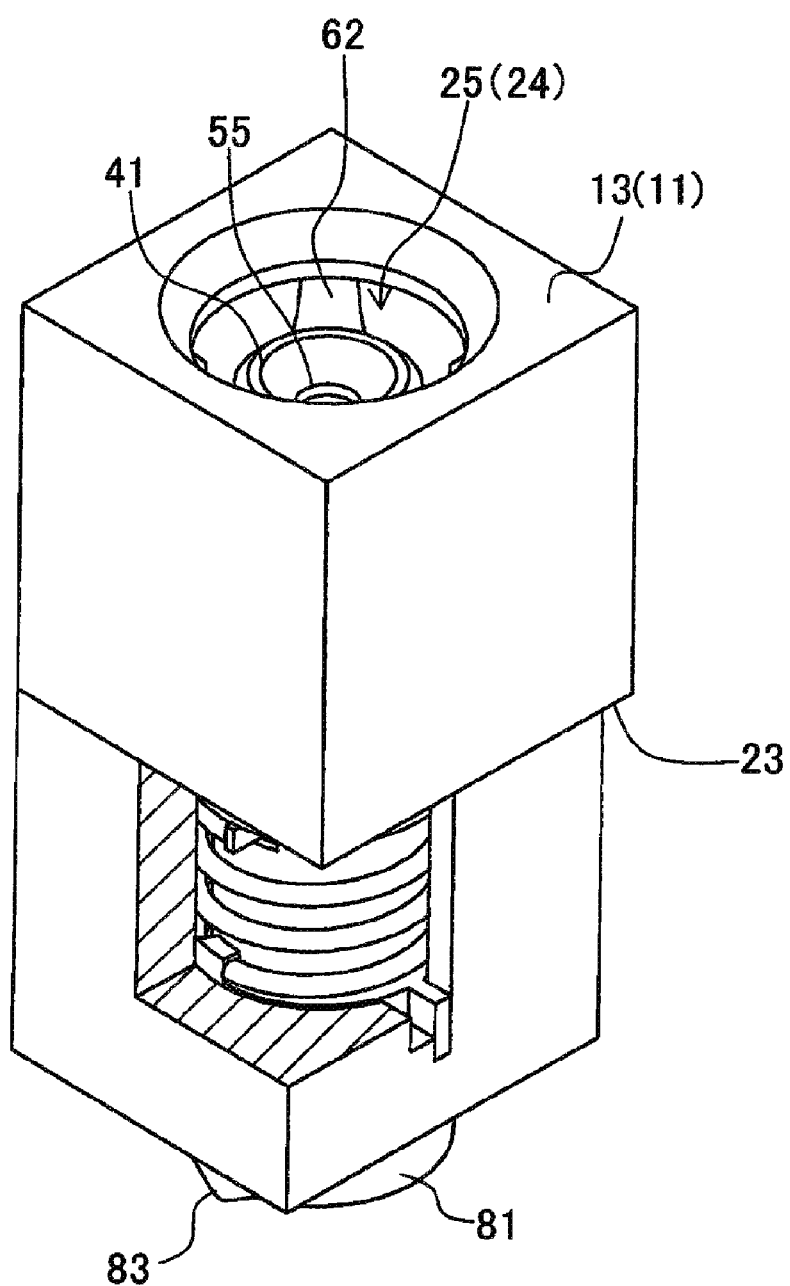
FIG. 8 is a partial view showing further assembly state of the connector shown in FIG. 1, with a partial cutout.

Afterwards, as shown in FIG. 8, the upper housing 13 is stacked or placed on the lower housing 12. With this, the coaxial terminal 51 is accommodated in the cavity 14 constructed of the upper cavity 25 and the lower cavity 24, thereby completing the assembly of the connector 1 as shown in FIG. 1. At this time, the outer conductor 62 and the cylindrical contact 81 are always electrically connected by the outer coil spring 71 which is in pressurized contact with the outer conductor 62 and the cylindrical contact 81.

Further, in the state that the coaxial terminal 51 is accommodated in the cavity 14, the lower end of the cylindrical contact 81 projects from the lower surface 12a of the lower housing 12 due to the downward biasing force of the outer coil spring 71. The two projecting contact points 83, of the cylindrical contact 81 projecting from the lower surface 12a of the lower housing 12, are brought into contact with the lands 151 of the circuit board 2 shown in FIG. 1. The cylindrical contact 81 is movable in the axial direction of the thin cylinder portion 67 (outer terminal 61), and by this movement of the cylindrical contact 81, a projection amount by which the cylindrical contact 81 projects from the lower surface 12a of the lower housing 12 can be changed or made variable. Similarly, the lower end of the shaft-shaped contact 59 also projects from the lower surface 12a of the lower housing 12, due to the downward biasing force of the center coil spring. The shaft-shaped contact 59 projecting from the lower housing 12 is brought into contact with the land 151 of the circuit board 2 shown in FIG. 1. Further, the shaft-shaped contact 59 is also movable in the axial direction of the center terminal 52; and by this movement of the shaft-shaped contact 59, a projection amount by which the shaft-shaped contact 59 projects from the lower surface 12a of the lower housing 12 can be changed or made variable.

Next, an explanation will be given about a method of attaching the connector 1 shown in FIG. 1 to the circuit board 2, with reference to FIGS. 9 to 15. Note that the states shown in FIGS. 10 to 13 respectively are in one-to-one correspondence to the states shown in FIGS. 9A to 9D. Further, the bottom view shown in FIG. 14 corresponds to the state shown in FIG. 9A and the bottom view shown in FIG. 15 corresponds to the state shown in FIG. 9C.

First, as shown in FIG. 9A, the pair of projecting contact points 83 of the cylindrical contact 81 and the shaft-shaped contact 59 are brought into contact with the lands 151 of the circuit board 2. At this time, as shown in FIG. 10, the movable pieces 85 of the cylindrical contact 81 are engaged with the fix recess portions 26 of the housing 11.

Next, the housing 11 is pressed against the circuit board 2. With this, as shown in FIGS. 9B to 9D, the cylindrical contact 81 and the shaft-shaped contact 59 are pushed into the housing 11. Then, as shown in FIG. 9D, the bottom surface 12a of the housing 11 is brought into contact with the circuit board 2, thereby attaching the connector 1 to the circuit board 2.

By pressing the housing 11 against the circuit board 2 in such a manner, the cylindrical contact 81 is pushed into the housing 11 against the biasing force of the outer coil spring 71 while being kept in pressure contact with the lands 151. Further, the shaft-shaped contact 59 pressed downward by the center coil spring (not shown) is also pushed into the housing 11 against the biasing force of the center coil spring while being kept in pressure contact with the land 151.

Figure 10:
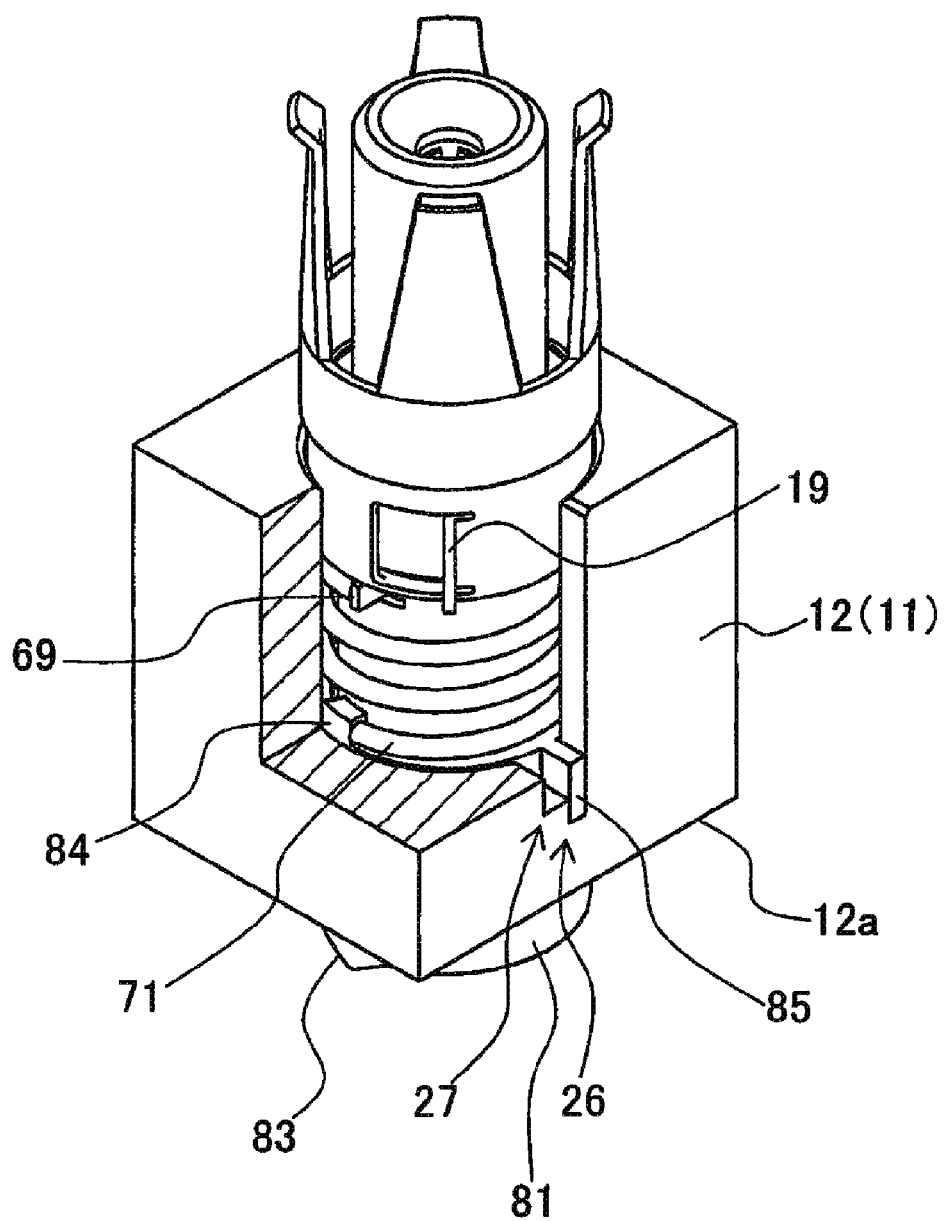
FIG. 10 is a partial perspective view of the connector corresponding to FIG. 9A, with partial cutout.
Figure 11:
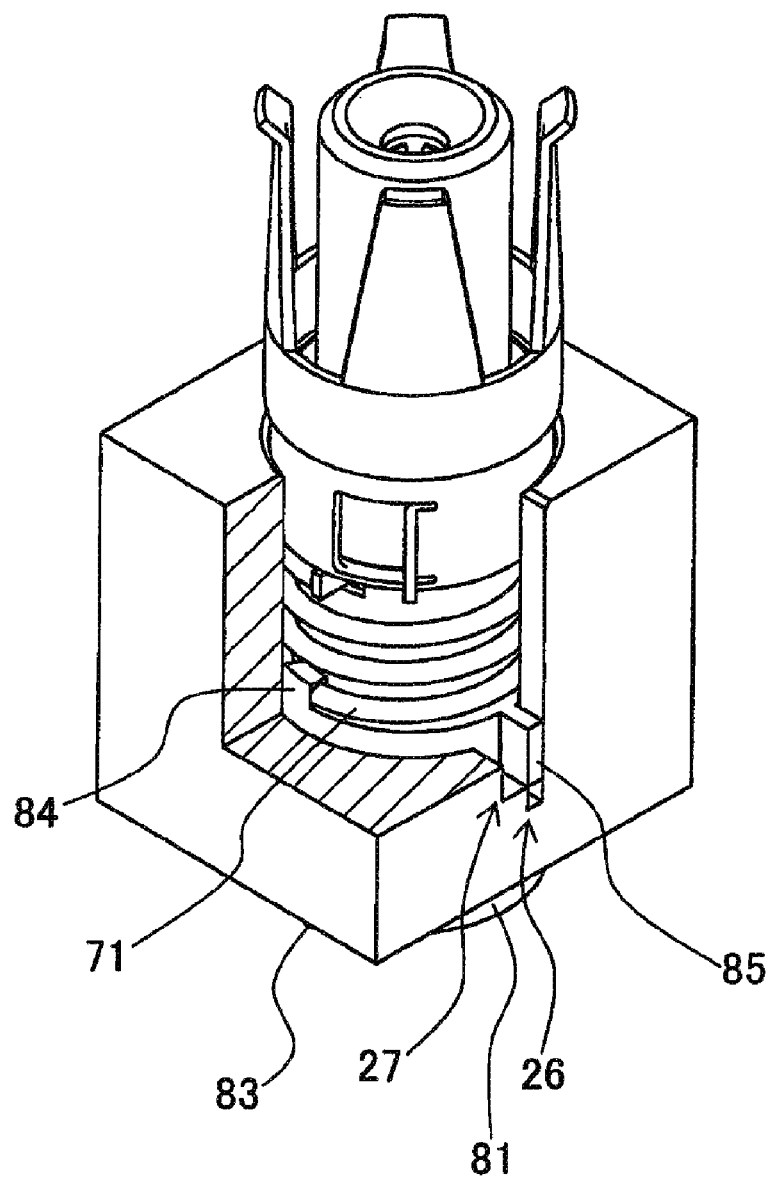
FIG. 11 is a partial perspective view of the connector corresponding to FIG. 9B, with partial cutout.
Figure 12:
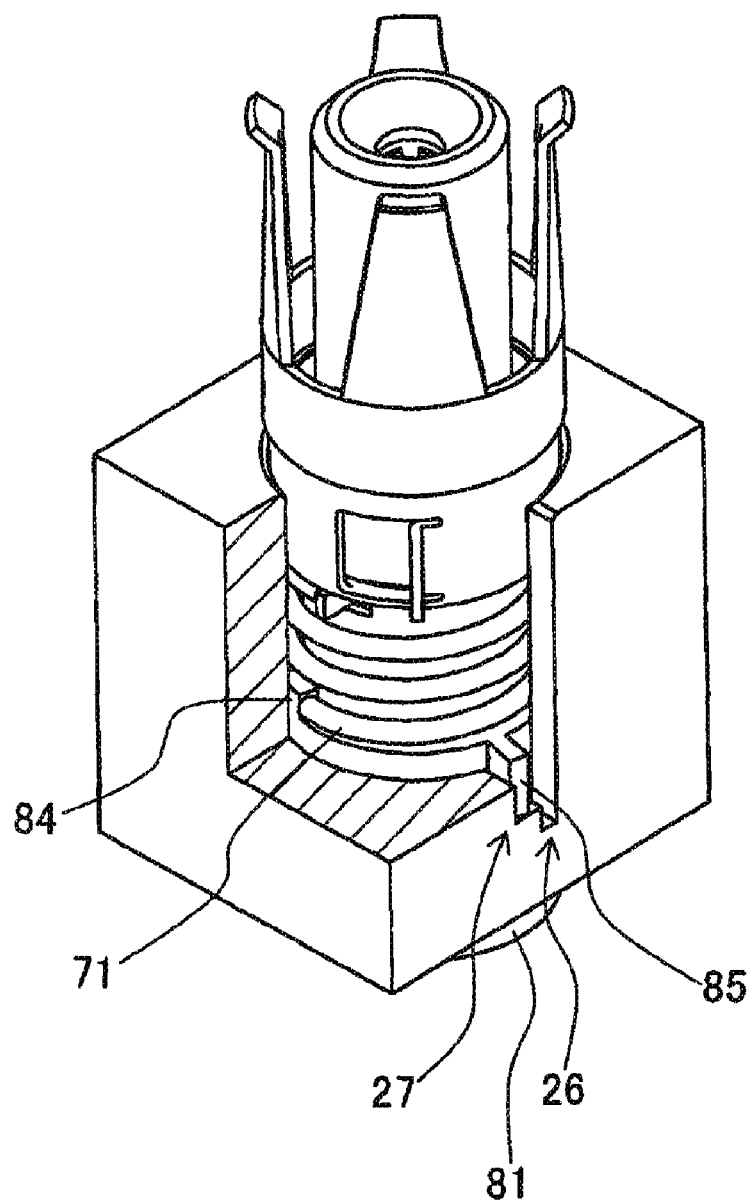
FIG. 12 is a partial perspective view of the connector corresponding to FIG. 9C, with partial cutout.
Figure 13:
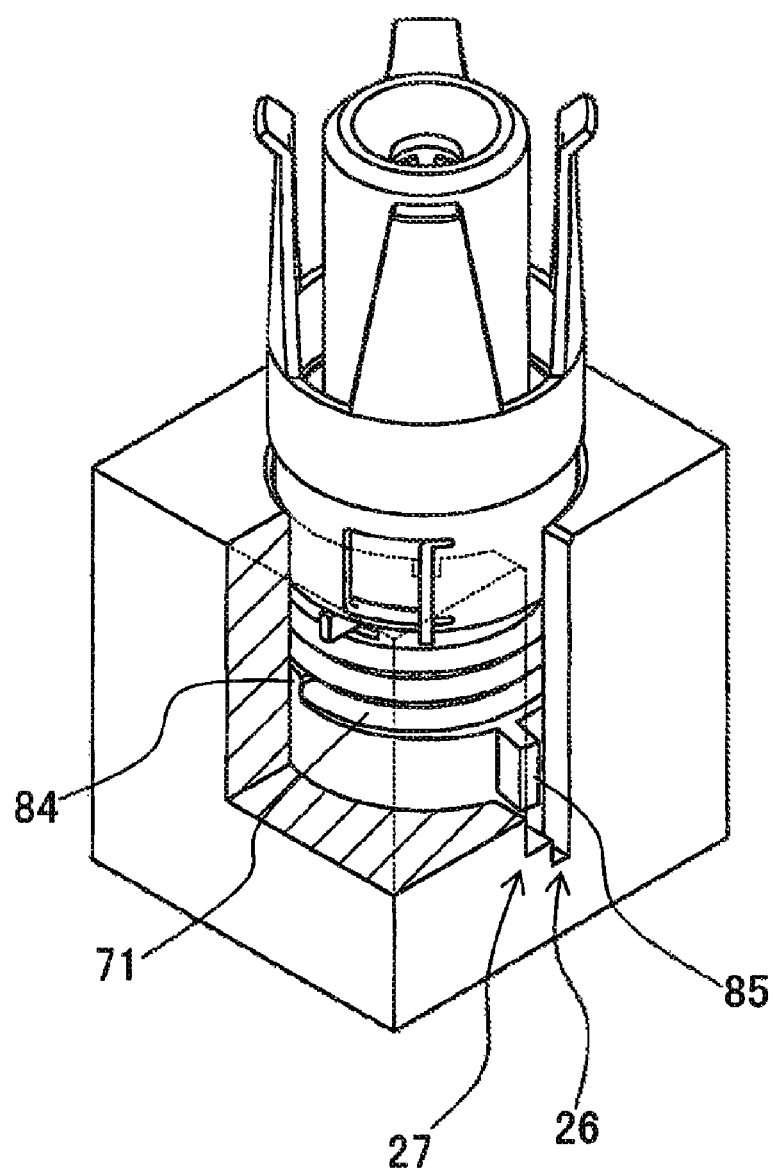
FIG. 13 is a partial perspective view of the connector corresponding to FIG. 9D, with partial cutout.
Figure 14:
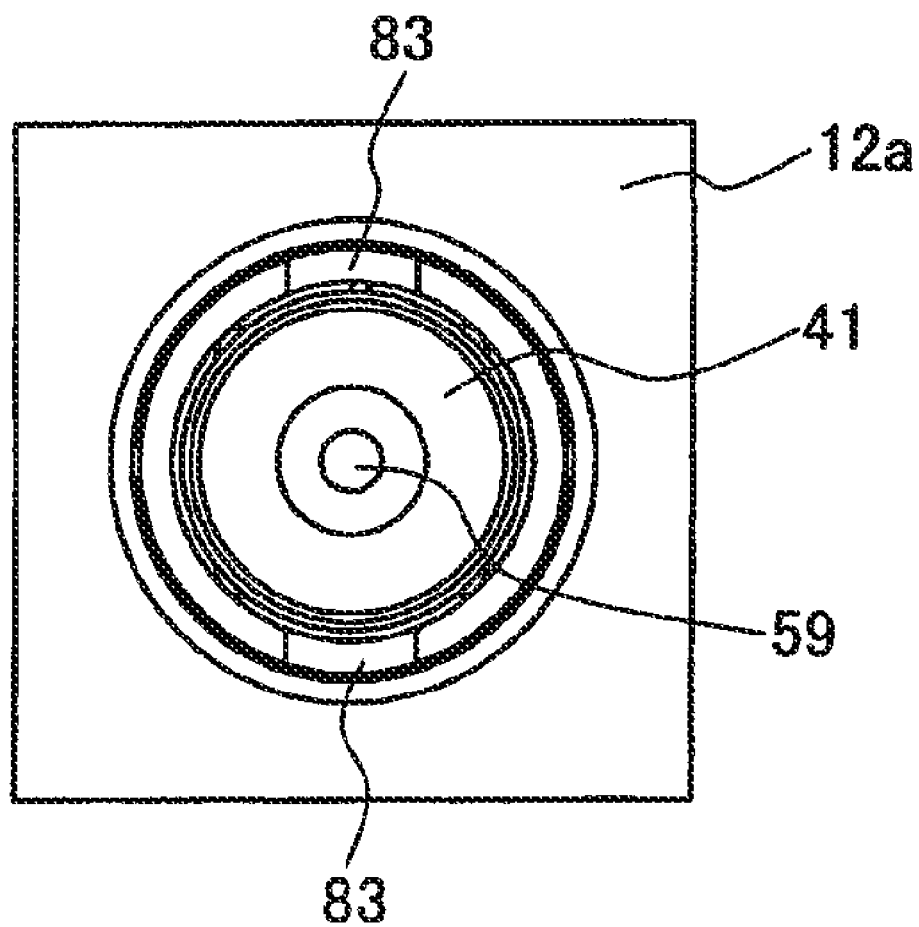
FIG. 14 is a partial bottom view of the connector in the state shown in FIG. 9A.
Figure 15:
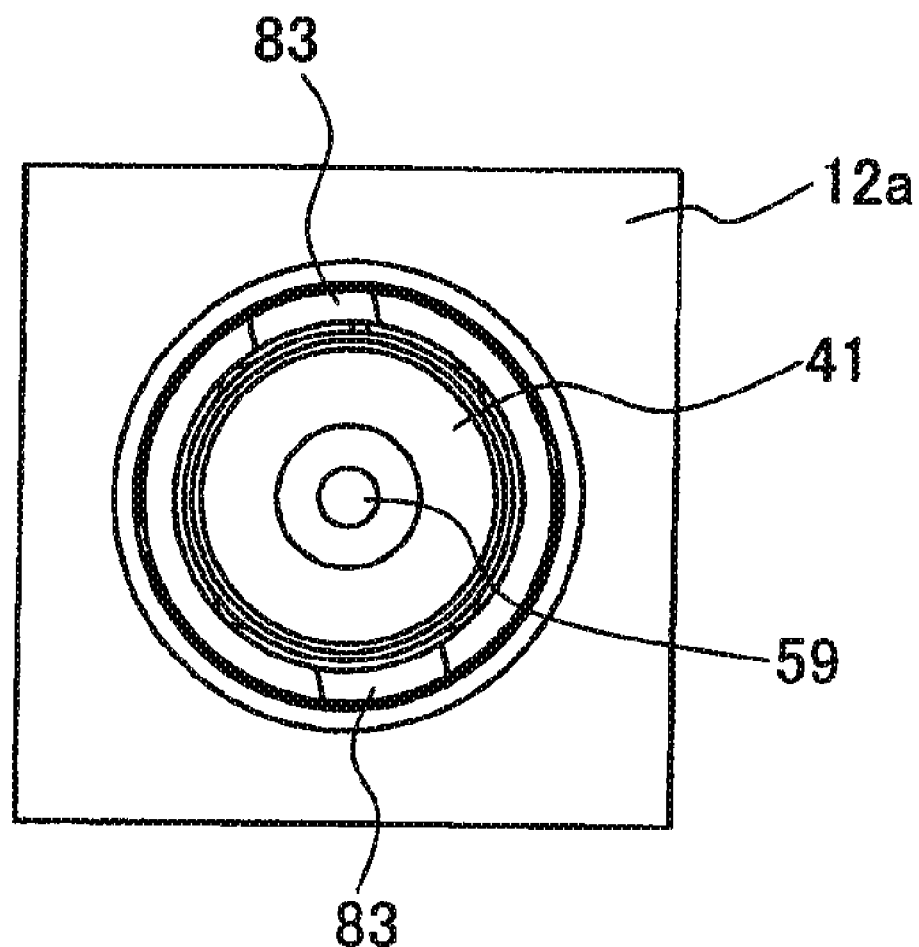
FIG. 15 is a partial bottom view of the connector in the state shown in FIG. 9C.

By pushing the cylindrical contact 81 into the housing 11 in such a manner, the movable pieces 85 inserted in the movable piece-slits 28 move upward in the movable piece-slits 28 as shown in FIGS. 10 to 13. Specifically, when the movable pieces 85 engaged with the fix recess portions 26 as shown in FIG. 10 start to move upwardly, the movable pieces 85 are disengaged or released from the fixed recess portions as shown in FIG. 11 and the movable pieces 85 are rotated together with the cylindrical contact 81 by the force of the outer coil spring 71 attempting to expand because the outer coil spring 71 is in the compressed state. Then, as shown in FIG. 12, the movable pieces 85 are engaged with the restricting recess portions 27; and as shown in FIG. 13, the movable pieces 85 move further upwardly in the movable piece-slits 28 while being kept engaged with the restricting recess portions 27. Note that as shown FIGS. 14 and 15 which are bottom views, the cylindrical contact 81 is rotated clockwise.

Further, the cylindrical contact 81 is rotated by the force of the outer coil spring 71 during a period of time during which the state shown in FIG. 11 is changed to the state shown in FIG. 12. Therefore, the projecting contact points 83 are moved on the lands 151 of the circuit board 2 while being kept in contact with the lands 151 as shown in FIGS. 9B and 9C. Further, also during this period, the downward force by the compressed outer coil spring 71 acts on the cylindrical contact 81. Therefore, the projecting contact points 83 are rubbed against the lands 151. Consequently, it is possible to rub off or remove an oxide film from the surfaces of the pair of projecting contact points 83 and of the lands 151 and to remove dust or dirt which has been caught between the projecting contact points 83 and the lands 151.

FIG. 16 is a perspective view showing a plug 3 which is to be attached to the connector 1 of this embodiment. The plug 3 includes a holder 121. In the holder 121, a plurality of cavities 123 are formed in arrangement corresponding to that of the coaxial probes 51 of the connector 1. In the cavities 123, the coaxial plugs 161 are inserted respectively. Each of the coaxial plugs 161 includes the axial terminal 162 and the surrounding terminal 163 which surrounds the axial terminal 162 and which is arranged coaxial with the axial terminal 162.

FIG. 17 is a view showing a state that the plug 3 is mated with the connector 1 which is attached to the circuit board 2. In this mated state, each of the coaxial plugs 161 of the plug 3 is mated with one of the coaxial probes 51 of the connector 1. Specifically, the axial terminal 162 of each of the coaxial plugs 161 is pushed into the mating portion 55 of one of the center conductors 53. With this, the axial terminal 162 of each of the coaxial plugs 161 is electrically and securely connected to the land 151 of the circuit board 2 via the center terminal 52. Further, the surrounding terminal 163 of each of the coaxial plugs 161 is inserted into a plurality of leaf springs 65 of the mating portion 55 of one of the outer conductors 62 to thereby push the leaf springs 65. With this, the surrounding terminal 163 of the coaxial plug 161 is electrically and securely connected to the land 151 of the circuit board 2 via the outer terminal 61.

As described above, by pressing the housing 11 in the contact state in FIG. 9A against the circuit board 2, the cylindrical contacts 81 is rotated while being pushed into the housing 11 as shown in FIGS. 10 to 13 and the connector 1 of this embodiment is attached to the circuit board 2 as shown in FIG. 9D. Therefore, the pair of projecting contact points 83 brought into contact with the lands 151 of the circuit board 2 in FIG. 9A are rotated on the lands 151 to rub against the lands 151 during a period of time during which the state shown in FIG. 9B is changed to the state shown in FIG. 9C. With this, it is possible to perform the wiping of the pair of projecting contact points 83 and the lands 151.

As described above, in the connector 1 of this embodiment, it is possible to perform the wiping upon attaching the connector 1 to the circuit board 2, even though the terminals of the connector 1 are the coaxial terminals 51. Further, by this wiping, it is possible to rub off or remove the oxide film from the surfaces of the pairs of projecting contact points 83 and the lands 151 and to remove dust caught therebetween, thereby making it possible to prevent the increase in contact resistance between the coaxial terminals 51 and the lands 151.

In addition, since each of the cylindrical contacts 81 is brought into pressure contact with the lands 151 by the outer coil spring 71, it is possible to bring the pairs of projecting contact points 83 into contact with the lands 151 before the housing 11 is attached to the circuit board 2, to bring the pairs of projecting contact points 83 into pressure contact with the lands 151 by a desired biasing force at the time of the wiping, and to reduce the contact resistance between the pairs of projecting contact points 83 and the lands 151 in the state that the housing 11 is attached to the circuit board 2.

Further, the pair of projecting contact points 83 are arranged on the cylindrical contact 81 at rotationally symmetric positions of the cylindrical shape of the cylindrical contact 81. With this, it is possible to limit or regulate a contact portion, at which the cylindrical contact 81 and the lands 151 are brought into contact with each other, to the pair of projecting contact points 83 and to assuredly bring the cylindrical contact 81 into contact with the lands 151. Further, it is sufficient that the lands 151 are formed on the circuit board 2 at a range in which the pairs of projecting contact points 83 perform the wiping, thereby eliminating any need to form the land 151 in a doughnut shape or the like corresponding to the cylindrical shape of the cylindrical contact 81. Furthermore, it is possible to prevent the cylindrical contacts 81 from erroneously wiping portions other than the lands 151 of the circuit board 2.

Since the terminals of the connector 1 are the coaxial terminals 51, it is possible to prevent crosstalk among the plurality of coaxial terminals 51. As a result, in the connector 1, it is possible to obtain the performance sufficient for transmitting or transferring high-frequency component of the signal. Accordingly, the connector 1 can be used, in an IC inspection apparatus or the like, for connecting a target circuit board having an IC as the measurement target mounted thereon to a measuring circuit board having a signal generator circuit, a comparator, etc. mounted thereon, with the coaxial cables and without any soldering.

Note that in this embodiment, although the pair of projecting contact points 83 are formed in each of the cylindrical contacts 81, it is allowable that the number of the projecting contact points 83 is one or not less than three. In a case that the plurality of projecting contact points 83 are formed in the cylindrical contact 81, the plurality of projecting contact points 83 may be provided on the cylindrical contact 81 having the cylindrical shape, in arrangement other than the rotational symmetry.

Further, in this embodiment, the projection 84 of the cylindrical contact 81 is pushed by the compressed outer coil spring 71. However, the cylindrical contact 81 may be rotated by pulling the projection 84 by the expanded outer coil spring 71.

Further, in this embodiment, the fix recess portions 26 and the restricting recess portions 27 which are engaged with the movable pieces 85 of the cylindrical contact 81 are formed in the housing 11. However, at least either one of the fix recess portions 26 and the restricting recess portions 27 may be formed in the coaxial terminal 51 at a portion which is different from the cylindrical contact 81 (for example, at the outer conductor 62 or the like). Further, at least one of the fix recess portion 26 and the restricting recess portion 27 may be a fix projection.

Figure 18:
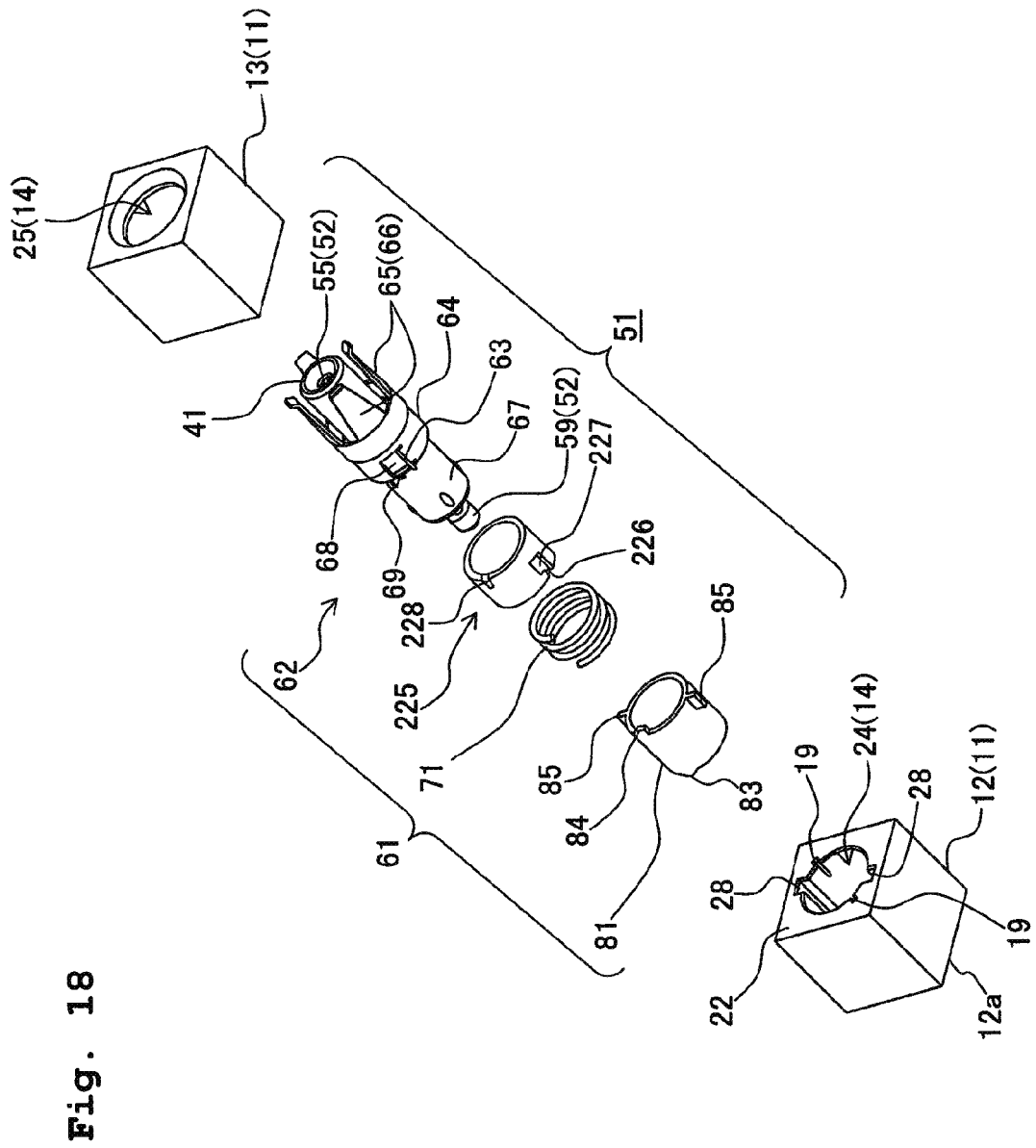
FIG. 18 is a partial exploded perspective view of a housing and a coaxial terminal of a connector of a modification of the present invention.
Figure 19:
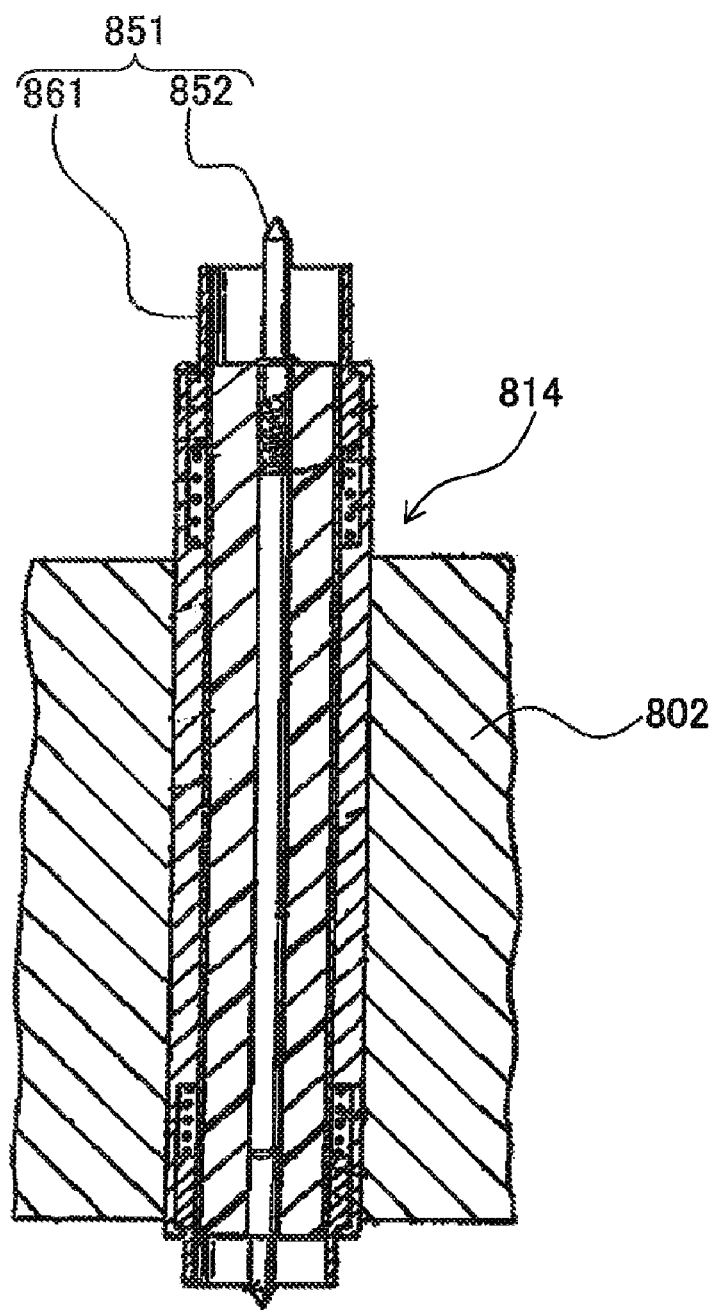
FIG. 19 is a cross-sectional view showing a conventional coaxial movable contact terminal.
Figure 20:
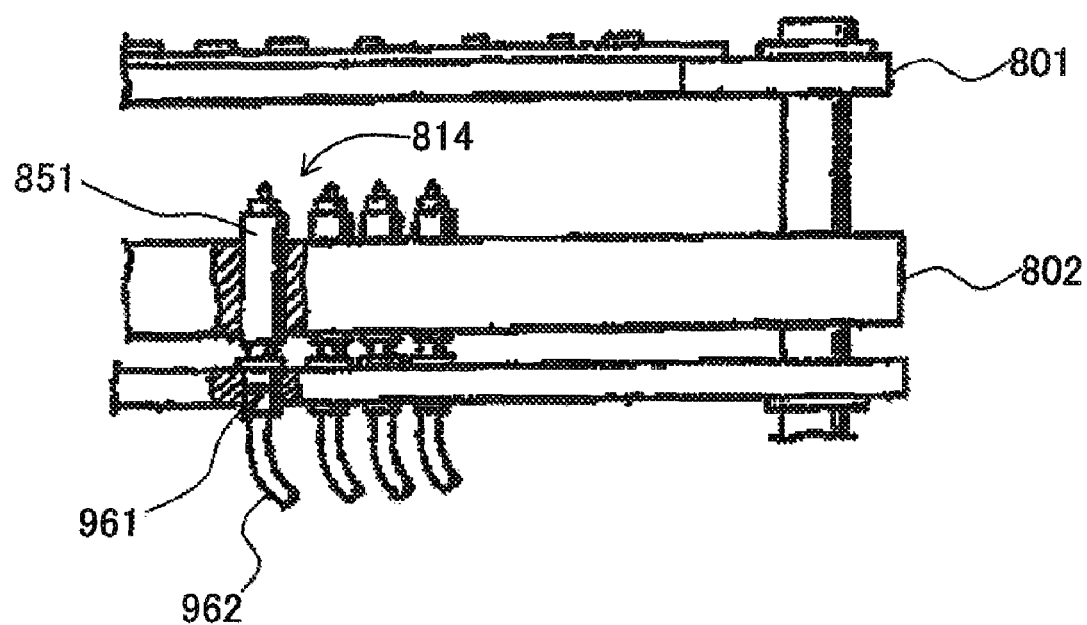
FIG. 20 is a view showing the coaxial movable contact terminal shown in FIG. 19 is in use.

FIG. 18 shows a partial exploded perspective view of a connector 1 according to a modification of the present invention. The connector 1 includes an outer terminal 61 which has an outer conductor 62, an outer coil spring 71, a cylindrical contact 81, and a cover 225. The cover 225 has a cylindrical shape of which inside diameter is greater than the outside diameter of each of the spring 71 and the cylindrical contact 81, and the cover 225 can accommodate, in an assembled state, the spring 71 and an upper portion of the cylindrical contact 81 inside the cover 225. Further, the cover 225 is arranged so that a slit 228, which is formed in the cover 225 at the upper edge of the cylindrical shape of the cover 225, is engaged with a fix piece, thereby preventing the cover 225 from rotating. Furthermore, the cover 225 is provided with fix recess portions 226 and restricting recess portions 227 which are formed in the cover 225 at the lower edge of the cylindrical shape of the cover 225, and which accommodate movable pieces 85 of the cylindrical contact 81 therein. With this structure, in a state that the cylindrical contact 81 projects from a lower surface 12a of a housing 11, the movable pieces 85 abut on the fix recess portions 226 and thus the cylindrical contact 81 does not rotate. Upon attaching the connector 1 to the circuit board 2, the cylindrical contact 81 is pushed into the housing 11, which results in the movable pieces 85 moving from the fix recess portions 226 to the restricting recess portions 227, thereby rotating the cylindrical contact 81 by the spring force of the outer coil spring 71.

Further, in this embodiment, the outer coil spring 71 is used to generate the force which acts on the cylindrical contact 81 such that the cylindrical contact 81 is projected from the housing 11. Alternatively, for example, the biasing force may be generated by using a leaf spring or the like to act on the cylindrical contact 81. Furthermore, the leaf spring may be formed as a leaf spring structure as a part of the housing 11.

The coaxial connector of the present invention can perform the wiping by rotating the cylindrical contacts brought into contact with the lands of the circuit board, upon attaching the coaxial connector to the circuit board. Therefore, it is possible to electrically connect the cylindrical contacts and the lands of the circuit board with a low contact resistance. Accordingly, the coaxial connector of the present invention can be used, for example in an IC inspection apparatus, etc., for connecting a target circuit board having an IC as the measurement target mounted thereon to a measuring circuit board having a signal generator circuit, a comparator, etc. mounted thereon, with the coaxial cable.

What is claimed is:

1. A coaxial connector which is attached to a circuit board having a land, the coaxial connector comprising:
    a coaxial terminal which has a coaxial structure including a center terminal and a cylindrical outer terminal surrounding the center terminal;
    a housing which accommodates the coaxial terminal;
    a cylindrical contact which is movable in an axial direction of an axis of the outer terminal and which is brought into contact with the land;
    a biasing member which biases the cylindrical contact so that the cylindrical contact projects from the housing; and
    a rotation mechanism which rotates the cylindrical contact about the axis when the cylindrical contact is pushed into the housing against a biasing force of the biasing member.

2. The coaxial connector according to claim 1, wherein the cylindrical contact has a plurality of projecting contact points which are arranged on the cylindrical contact at rotationally symmetric positions of a cylindrical shape of the cylindrical contact to project from the cylindrical contact and which are brought into contact with the land.

3. The coaxial connector according to claim 1, wherein the biasing member is a coil spring which is arranged coaxially with the coaxial terminal;
    the rotation mechanism includes a projection which is formed in the cylindrical contact and with which one end of the coil spring is brought into contact; and
    the cylindrical contact is rotated when the coil spring is expanded or compressed to pull or push the projection.

4. The coaxial connector according to claim 3, wherein the coil spring is brought in contact with the projection in a state that the coil spring is compressed.

5. The coaxial connector according to claim 1, wherein the rotation mechanism includes a fix portion which is formed in the coaxial terminal or the housing, and a movable portion which is formed in the cylindrical contact and which is engaged with the fix portion; and
    the cylindrical contact starts to rotate when the cylindrical contact is pushed into the housing to disengage the movable portion from the fix portion.

6. The coaxial connector according to claim 5, wherein the rotation mechanism further includes a restricting portion which is formed in the coaxial terminal or the housing and which is engaged with the movable portion, disengaged from the fix portion, to restrict movement of the movable portion.

* * * * *